US006872585B2

(12) United States Patent
Matsumura et al.

(10) Patent No.: US 6,872,585 B2
(45) Date of Patent: Mar. 29, 2005

(54) LED DEVICE AND MANUFACTURING METHOD THEREOF

(75) Inventors: Kanae Matsumura, Nishikasugai-gun (JP); Yuji Takahashi, Nishikasugai-gun (JP); Hideaki Kato, Nishikasugai-gun (JP); Shunsuke Ohtsuka, Tokyo (JP)

(73) Assignees: Toyoda Gosei Co., Ltd., Aichi (JP); Koha Co., Ltd., Tokyo (JP)

( * ) Notice: Subject to any disclaimer, the term of this patent is extended or adjusted under 35 U.S.C. 154(b) by 0 days.

(21) Appl. No.: 10/842,494

(22) Filed: May 11, 2004

(65) Prior Publication Data

US 2004/0206964 A1 Oct. 21, 2004

Related U.S. Application Data

(62) Division of application No. 10/231,067, filed on Aug. 30, 2002, now Pat. No. 6,812,481.

(30) Foreign Application Priority Data

| | | |
|---|---|---|
| Sep. 3, 2001 | (JP) | P2001-265422 |
| Sep. 3, 2001 | (JP) | P2001-265423 |
| Sep. 3, 2001 | (JP) | P2001-265424 |

(51) Int. Cl.[7] .................... H01L 21/00
(52) U.S. Cl. .................... 438/25; 438/26; 438/111
(58) Field of Search .................... 438/25, 26, 111; 257/666

(56) References Cited

U.S. PATENT DOCUMENTS

| | | | |
|---|---|---|---|
| 4,925,811 | A | 5/1990 | Menigaux et al. |
| 5,632,663 | A | 5/1997 | Ishihara et al. |
| 5,641,611 | A | 6/1997 | Shieh et al. |
| 5,864,206 | A | 1/1999 | Ishihara et al. |
| 5,949,188 | A | 9/1999 | Leising et al. |
| 6,033,926 | A | 3/2000 | Chakrabarti et al. |
| 6,541,130 | B2 | 4/2003 | Fukuda et al. |

(Continued)

FOREIGN PATENT DOCUMENTS

| | | | |
|---|---|---|---|
| JP | 07-129099 | 5/1995 | |
| JP | 07-235624 | 9/1995 | |
| JP | 09-036434 | 2/1997 | |
| JP | 09-139524 | 5/1997 | |
| JP | 10-012926 | 1/1998 | |
| JP | 10-149767 | 2/1998 | |
| JP | 10-200166 | 7/1998 | |
| JP | 11-298041 | 10/1999 | |
| JP | 2003-78172 | * 3/2004 | ............ H01I/33/00 |

*Primary Examiner*—David S. Blum
(74) *Attorney, Agent, or Firm*—McGinn & Gibb, PLLC

(57) ABSTRACT

In an LED device, an opening portion of a package in which a plurality of five light-emitting elements are mounted is filled with a transparent epoxy resin and sealed with the resin. The transparent epoxy resin is shrunk when cured. Hence, the surface of the transparent epoxy resin is dented in the center portion so that the outer edge portion becomes higher than the center portion. The light-emitting elements located at opposite ends are the highest in element height among the five light-emitting elements. Hence, when the light-emitting elements are mounted at opposite ends of a single row, distances from light-emitting surfaces of the five light-emitting elements to the surface of the transparent epoxy resin are made uniform and luminous intensity distribution characteristics thereof are made uniform. Tips of leads are further bent up along side surfaces of the package. Hence, when the LED device is soldered onto a mount board, solder is deposited even on the up-bent tips of the leads, so that surface tension of solder is balanced on the front and rear of the package. As a result, the LED device can be mounted in a predetermined position while prevented from sliding. In an LED lead frame, hanger leads are provided so as to be extended in three directions of a package. Hence, the electrically conductive leads can be bent stably and accurately without tottering of the package in the process of bending the electrically conductive leads.

6 Claims, 6 Drawing Sheets

11 13b 16 2 13c 13a 13d 16 3 4f 16 16 4a 4b 4c 3a 4d 4e

U.S. PATENT DOCUMENTS 6,552,488 B1 4/2003 Roitman et al.
6,563,139 B2 5/2003 Hen
6,563,263 B1 5/2003 Kawaguchi et al.
6,624,491 B2 * 9/2003 Waitl et al. ................. 257/434
6,737,735 B2 * 5/2004 Ito ............................. 257/667
6,777,262 B2 * 8/2004 Miyaki et al. .............. 438/106
6,800,996 B2 * 10/2004 Nagai et al. ................ 313/512

* cited by examiner

INTENSITY
[%]
100
80
60
40
20
0
−90
−60
−30
0
30
60
90 [ ° ]
ANGLE OF BEAM SPREAD
R1
R2
G
B1
B2

LED DEVICE AND MANUFACTURING METHOD THEREOF

The present Application is a Divisional Application of U.S. patent application Ser. No. 10/231,067,filed on Aug. 30, 2002, now U.S. Pat. No. 6,812,481.

The present application is based on Japanese Patent Applications No. 2001-265422, 2001-265423 and 2001-265424, which are incorporated herein by reference.

BACKGROUND OF THE INVENTION

1. Field of the Invention

The present invention relates to a light-emitting diode lamp (hereinafter referred to as "LED lamp") in which a single light-emitting element or a plurality of light-emitting elements, and leads and wires electrically connected to the single or plurality of light-emitting element(s) are packed in a package such as a synthetic resin package and sealed with a light-transmissive material such as a transparent epoxy resin. Incidentally, in this specification, an LED chip itself is called "light-emitting element" whereas a light-emitting device having a plurality of LED chips mounted therein is collectively called "light-emitting diode lamp" or "LED lamp", further, more comprehensively called "LED device". A lead frame as a raw material thereof is called "LED lead frame".

2. Description of the Related Art

A surface mounting chip LED (SMD) type LED lamp has been heretofore used in a light source for a backlight unit, or the like. In the SMD type LED lamp, a plurality of metal leads disposed in an injection-molded synthetic resin package, and a plurality of light emitting elements mounted on one of the leads and electrically connected to the other leads by wire-bonding are entirely sealed with a transparent epoxy resin or the like.

In the LED lamp having such a plurality of light-emitting elements, however, luminous intensity distribution characteristic varies in accordance with the respective light-emitting elements. Moreover, heat-radiating characteristic is worsened compared with that of a package of a single light-emitting element. Hence, the respective light-emitting elements become uneven both in heat-radiating characteristic and in light-emitting efficiency. In addition, there arises a problem that color-mixing characteristic is worsened when a plurality of light-emitting elements different in wavelength are mounted in the LED lamp.

Further, in this LED lamp, however, lead portions (LED loads) by which the lamp is bonded on the mount board via solder is made flat. The viscosity of solder is reduced instantaneously when the LED lamp is made to pass through a reflow furnace at a high temperature in order to solder the LED lamp onto the mount board. For this reason, surface tension of solder is applied on the lead portions but the LED lamp is hardly positioned because the lead portions are so flat that the LED lamp slides. For this reason, in the LED lamp having such leads bent once, there is a problem that accurate mounting can be hardly made.

Still further, an example of a related-art LED lead frame for the LED lamp will be described with reference to FIG. 7. FIG. 7 is a plan view showing the configuration of the related art LED lead frame.

As shown in FIG. 7, in the LED lead frame 21, four electrically conductive leads 25*a*, 25*b*, 25*c* and 25*d* are protruded inward from an outer frame 23 so that an injection-molded synthetic resin package 22 is fixed to tips of the leads. A plurality of light-emitting elements are mounted in the package 22, electrically connected to the LED lead frame 21 by wire-bonding and then sealed with a scaling resin. Thus, a body portion of an LED lamp is produced. Then, the electrically conductive leads 25*a*, 25*b*, 25*c* and 25*d* are cut into a predetermined length and then bent along the outer circumference of the package 22. Thus, a surface-mountable LED lamp is obtained.

In the LED lead frame 21, however, nothing supports the package 22 after the electrically conductive leads 25*a*, . . . , and 25*d* are cut. Therefore, the package 22 must be fixed by a jig or something when the electrically conductive leads 25*a*, . . . , and 25*d* are to be bent back or forth along the outer circumference of the package 22. For this reason, there is fear that the package 22 may be broken. Moreover, the electrically conductive leads 25*a*, . . . , and 25*d* cannot be bent accurately because the package 22 cannot be fixed firmly. Hence, there is a problem that, inconsistency in positioning accuracy with respect to a partner member may occur in a post-process.

SUMMARY OF THE INVENTION

Therefore, an object of the present invention is to provide an SMD type LED device in which uniformity of luminous intensity distribution characteristic in respective light-emitting elements and improvement both in heat radiating characteristic and in color-mixing characteristic can be achieved.

Another object of the present invention is to provide an LED device which can be positioned stably without sliding of the LED device when soldered onto a mount board and which can be mounted on the mount board accurately.

Still another object of the present invention is to provide a method for manufacturing an LED device lead frame in which electrically conductive leads can be bent with stable accuracy while a package is fixed firmly without being damaged in a process of bending the electrically conductive leads, and an LED device lead frame used for manufacturing the LED device.

(1) According to the invention, there is provided an LED device having: a plurality of light-emitting elements sealed with a light-transmissive material in a package, wherein: the plurality of light-emitting elements are arranged in a single row in the inside of an opening portion of the package and in order of element height so that a light-emitting element higher in element height is disposed on a outer side of the single row; and the inside of the opening portion of the package is sealed with the light-transmissive material.

The light-transmissive material for sealing the inside of the opening portion of the package is shrunk when cured from a liquid state. For this reason, the surface of the light-transmissive material in the center portion of the package is dented so that the outer side of the package becomes higher than the center portion. Accordingly, when the plurality of light-emitting elements are arranged in such order of element height that a light-emitting element higher in element height is disposed on an outer side of the single row, distances from light emitting surfaces of the respective light-emitting elements to the surface of the light-transmissive material are made uniform, so that luminous intensity distribution characteristic is made uniform.

In this manner, in the LED device having a plurality of light-emitting elements sealed with a light-transmissive material in a package, luminous intensity distribution characteristic can be improved.

(2) According to the invention, in the LED device having the configuration defined in (1), one shoot of electrically conductive lead for mounting the plurality of light-emitting elements protrudes out of the package to thereby form a protrusion provided in a center portion of the package.

With such a configuration, distances from the respective light-emitting elements to a heat-radiating portion are made uniform, so that heat radiation is made uniform. Accordingly, light-emitting efficiency is made uniform, so that the LED device can be provided as an excellent LED device.

(3) According to the invention, in the LED device having the configuration defined in (1) or (2), the opening portion has its periphery constituted by slopes provided in a lengthwise direction of the package and slopes provided in a widthwise direction of the package, and the slopes provided in the lengthwise direction are different in inclination from the slopes provided in the widthwise direction so that the inclination of the slopes provided in the widthwise direction is gentler.

With such a configuration, the opening portion is formed so that light is not diffused in the lengthwise direction but light is diffused in the widthwise direction. Hence, it is easy to guide light into a thin light guide plate. This contributes to increase in luminance of a backlight unit. In addition, when a plurality of such LED devices are used, color mixing characteristic of adjacent LED devices is improved.

(4) According to the invention, in the LED device having the configuration defined in any one of (1) through (3), the plurality of light-emitting elements are different in wavelength of emitted light and are arranged in a single row at intervals of a narrow pitch.

With such a configuration, color-mixing characteristic of the light-emitting elements is improved in all wavelengths of emitted light, so that good color-mixing characteristic is obtained when light in full color is emitted from the LED device.

(5) According to the invention, in the LED device having the configuration defined in any one of (1) through (4), the plurality of light-emitting elements include at least one red light emitting element, at least one green light-emitting element, and at least one blue light-emitting element.

In this manner, when the LED device is constituted by three color types of light emitting elements for emitting light in red, green and blue which are light's three primary colors, the LED device can be used as a light source for a backlight unit because white light is emitted from the LED device. In addition, because the opening portion is formed so that light is diffused in the widthwise direction, it its easy to guide light into a thin light guide plate. Hence, the LED device contributes to increase in luminance of a backlight unit.

(6) According to the invention, in the LED device having the configuration defined in any one of (1) through (5), the plurality or light-emitting elements include two red light-emitting elements disposed on outer sides respectively, two blue light-emitting elements disposed on inner sides of the two red light-emitting elements respectively, and one green light-emitting element disposed in a center of the single row.

Each of a red light-emitting element and a blue light-emitting element is lower in luminance than a green light-emitting element. Hence, when two red light-emitting elements and two blue-light-emitting elements are used, the three colors are balanced to obtain white light emission in a state of uniform heat load balance. Moreover, because a blue light-emitting element is superior in light-emitting efficiency to a green light-emitting element, the LED device is suitable for the purpose of requiring bluish white light or for the purpose of requiring electric power saving. In addition, a red light-emitting element is higher in element height than each of a green light-emitting element and a blue-light-emitting element. Hence, when the red light-emitting elements are disposed on outermost sides respectively, distances from light-emitting surfaces of the respective light-emitting elements to the surface of the sealing material dented in the center portion are made uniform, and luminous intensity distribution characteristic is improved.

(7) According to the invention, there is provided an LED device having: a package; a plurality of leads; a plurality of light-emitting elements electrically connected to the plurality of leads; and a light-transmissive material with which the plurality of leads and the plurality of light-emitting elements are sealed in the package; wherein: protrusions of the plurality of leads pulled down out of the package are bent back and forth and/or left and right along a lower surface of the package; and tips of the plurality of bent leads are further bent up along side surfacer of the package.

Hence, when the LED device is soldered onto a mount board, solder is deposited even on the tips of the leads bent up along the side surfaces of the package. Surface tension of solder is balanced on the front and rear or left and right of the package while the skirts of solder are widened. Hence, the LED device can be mounted in a predetermined position while prevented from sliding.

In this manner, because the leads are bent up, that is, bent twice, surface tension of solder is balanced on the front and rear or left and right of the package while the skirts of solder are widened. Hence, the positioning accuracy of the LED device is improved, so that the LED device can be mounted accurately.

(8) According to the invention, in the LED device having the configuration defined in (7), protrusions of the plurality of leads are bent back and forth along a lower surface of the package, and tips of the plurality of bent leads are further bent up along side surfaces of the package.

In this manner, because the direction of bending of the leads is limited to a back-and forth direction, solder can be deposited on the package along the lengthwise direction of the package when the LED device is mounted. Hence, the length on which surface tension of the solder is applied is elongated so that more strongly balanced force is applied on the LED device. As a result, the LED device can be positioned more accurately when mounted.

(9) According to the invention, there is provided an LED lead frame for producing an LED device having a single light-emitting element or a plurality of light-emitting elements sealed with a light-transmissive material in a package, having: a plurality of electrically conductive leads for mounting the single light-emitting element or the plurality of light-emitting elements packed in the package, the plurality of electrically conductive leads being protruded out from one side of the package and connected to an outer frame of the LED lead frame; and a plurality of hanger leads protruded out from three sides of the package other than the one side of the package and connected to the outer frame.

In the LED load frame configured as described above, even after the electrically conductive leads are cut into a predetermined length, the package is fixed to the outer frame by the hanger leads extended in other three directions. Accordingly, also in a process of banding back or forth the electrically conductive leads along the package, the electrically conductive leads can be bent accurately without tottering because the package is fixed firmly. Moreover, because the package is fixed to the outer frame by the hanger leads extended in three directions, it is unnecessary to press the package so long as the outer frame is fixed firmly. Hence, there is no fear that the package may be broken. Incidentally, after the process of bending the electrically conductive leads is completed, the hanger leads which have become unnecessary may be preferably removed.

In this manner, the LED lead frame is provided as an LED lead frame in which the electrically conductive leads can be bent with stable accuracy while the package is fixed firmly without being damaged in the process of bending the electrically conductive leads.

(10) According to the invention, in the LED lead frame having the configuration defined in (9), ones of the plurality of hanger leads are provided in a direction of a side which is among the three sides of the package and opposite to the one side of the package.

In this manner, because a plurality of hanger leads are provided in a direction of a side opposite to the one side of the package, that is, in a direction opposite to the pulling-out direction of the electrically conductive leads, the package can be surely prevented from warping when the electrically conductive leads are bent back or forth along the package in the process of bonding the electrically conductive leads. Hence, the electrically conductive leads can be bent more surely with stable accuracy.

(11) According to the invention, in the LED lead frame having the configuration defined in (9) or (10), the ones of the plurality of hanger leads provided in the direction of the side which is among the three sides of the package and opposite to the one side of the package are wide.

In this manner, because each of the hanger leads provided in a direction of a side opposite to the one side of the package, that is, in a direction opposite to the pulling-out direction of the electrically conductive leads is made wide, stiffness becomes large. Hence, the package can be surely prevented from warping when the electrically conductive leads are bent back or forth along the package in the process of bending the electrically conductive leads. Hence, the electrically conductive leads can be bent more surely with stable accuracy.

(12) According to the invention, in the LED lead frame having the configuration defined in any one of (9) through (11), ones of the plurality of hanger leads provided in directions of two sides among the three sides of the package and substantially perpendicular to the plurality of electrically conductive leads are wide.

In this manner, because each of the hanger leads provided in two directions substantially perpendicular to the plurality of electrically conductive leads is made wide, stiffness against warping force in the widthwise direction becomes large. Hence, the package can be surely prevented from warping when the electrically conductive leads are bent back or forth along the package in the process of bending the electrically conductive leads. Hence, the electrically conductive leads can be bent more surely with stable accuracy.

Further, using the LED lead frame according to any one of (9) to (12), an LED device described in any one of (1) to (8) or any other type of devices may ha manufactured. The LED lead frame has at least one electrically conductive lead connected to one side of an outer frame of said LED lead frame, and a plurality of hanger leads protruded out toward and connected to three sides of said outer frame different from said one side to which said electrically conductive lead is connected. Next, at least one light-emitting element is mounted on said electrically conductive lead. Further, the light-emitting element is sealed with a light-transmissive material to form a package containing the light-emitting element such that a part of said electrically conductive lead is protruded out from said one side of said package and connected to said outer frame. The electrically conductive lead is separated from said outer frame. Thereafter, the electrically conductive lead is folded. In the case where a plurality of electrically conductive leads are formed in the LED lead frame, adjacent leads are folded different in thickness direction of the LED lead frame.

Features and advantages or the invention will be evident from the following detailed description of the preferred embodiments described in conjunction with the attached drawings.

DETAILED DESCRIPTION OF THE PREFERRED EMBODIMENTS

Figure 1A:
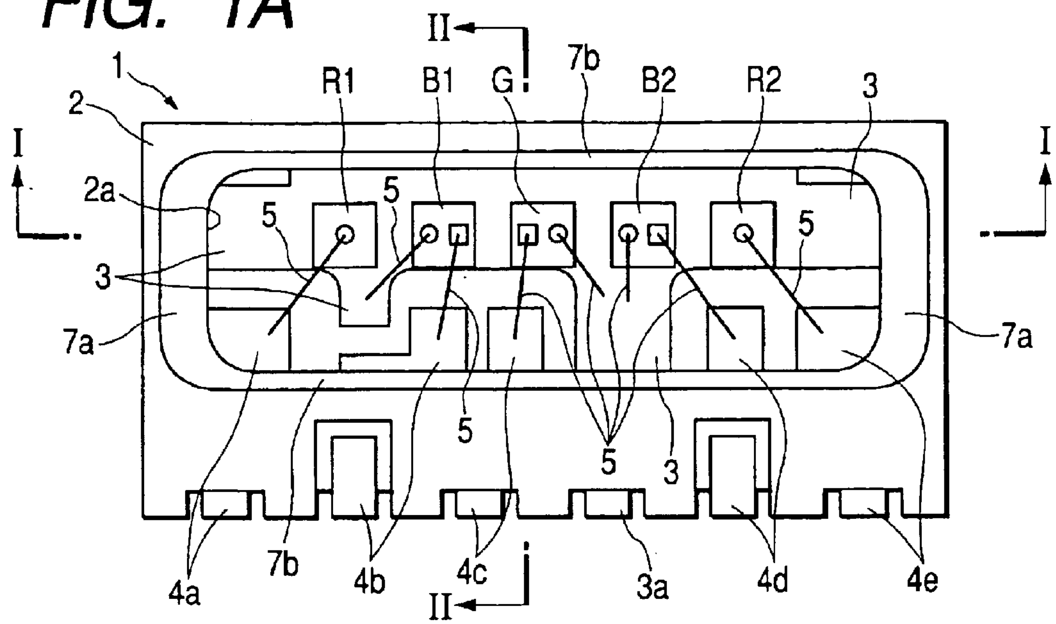
FIG. 1A is a front view showing the configuration of an LED lamp according to an embodiment or the invention.
Figure 1B:
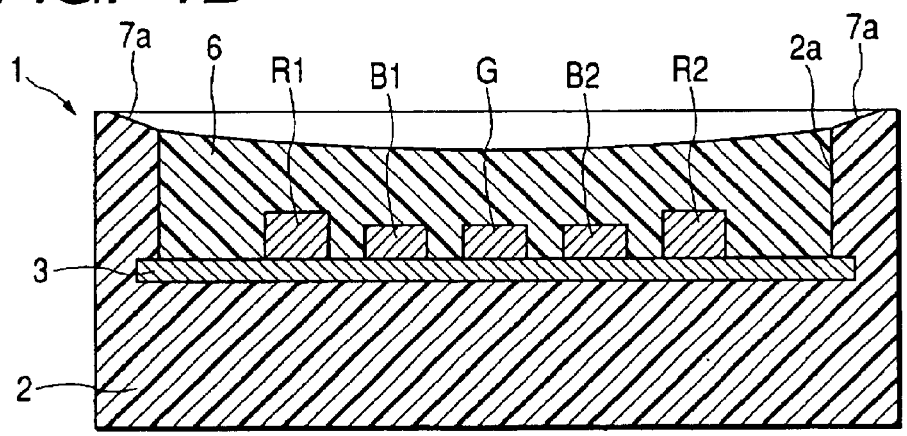
FIG. 1B is a sectional view taken along the line I—I in FIG. 1A.
Figure 1C:
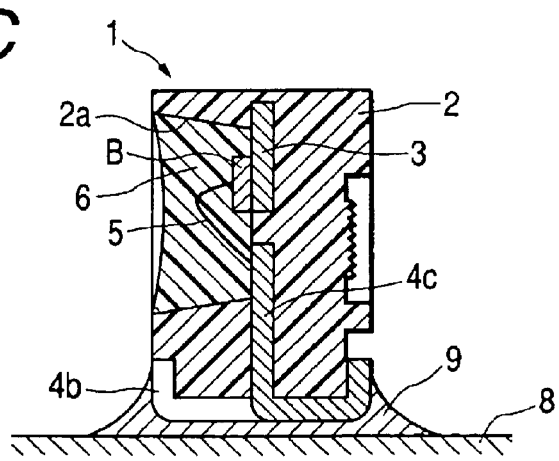
FIG. 1C is a sectional view taken along the line II—II in FIG. 1A.
Figure 2:
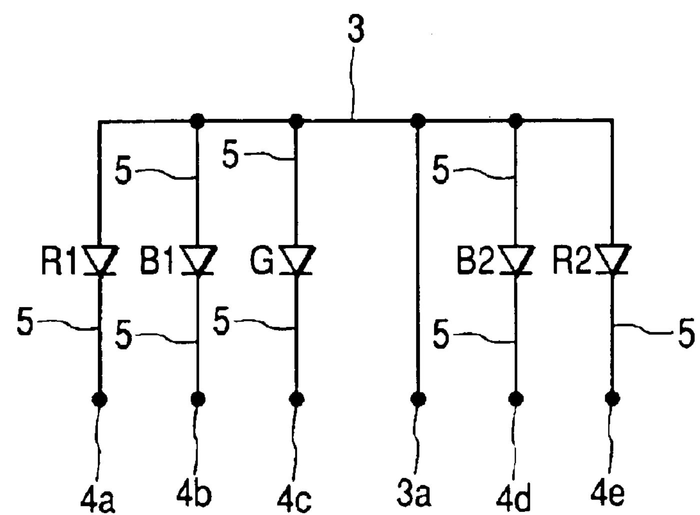
FIG. 2 is a circuit diagram showing the circuit configuration of the LED lamp according to the embodiment of the invention.
Figure 3:
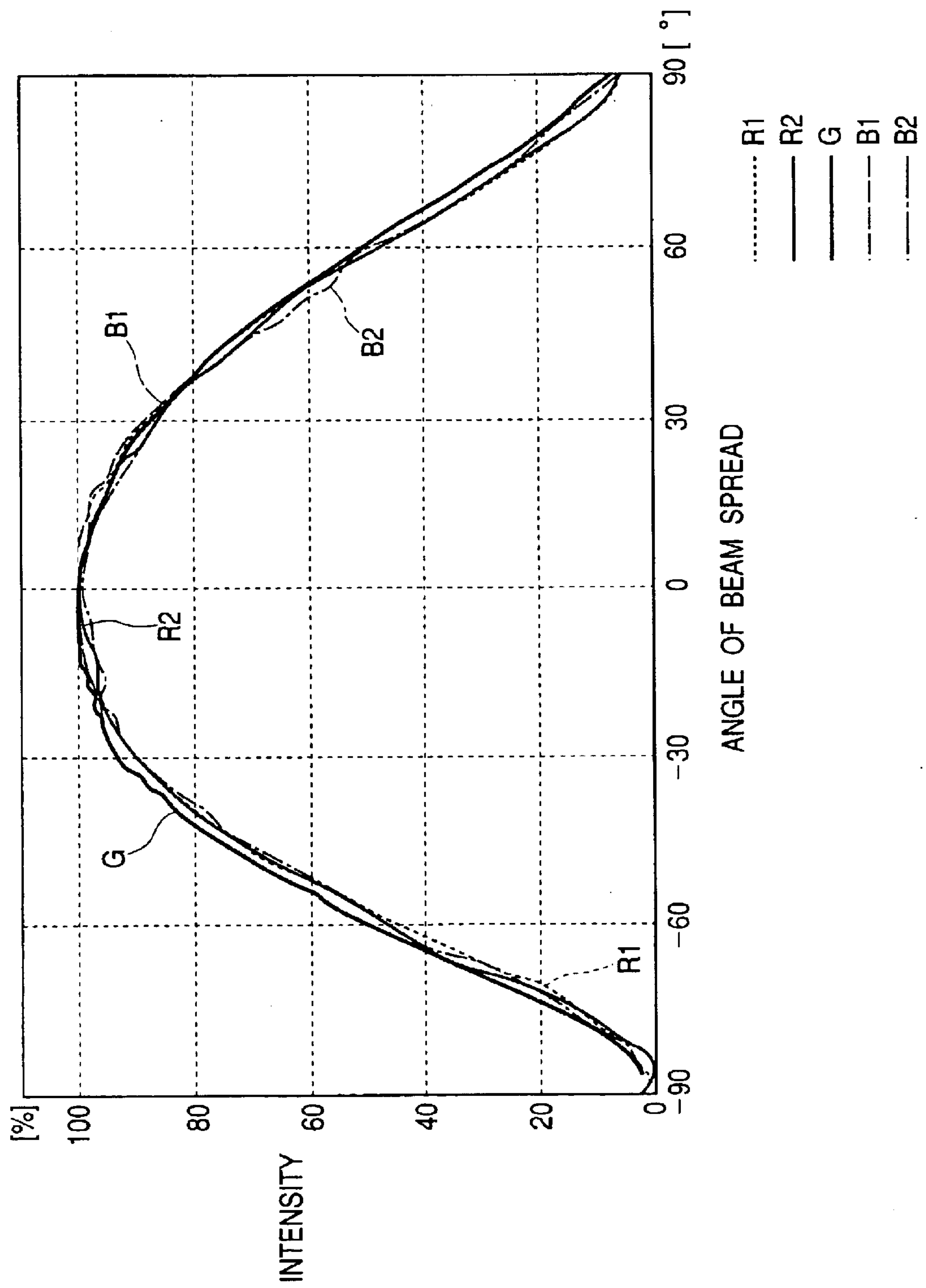
FIG. 3 is a graph showing luminous intensity distribution characteristic of the LED lamp according to the embodiment of the invention.

An embodiment of the invention will be described below with reference to FIGS. 1A, 1B, 1C and FIGS. 2 and 3. FIG. 1A is a front view showing the configuration of an SMD type LED lamp according to an embodiment of the LED device of the invention. FIG. 1B is a sectional view taken along the I—I in FIG. 1A. FIG. 1C is a sectional view taken along the line II—II in FIG. 1A. FIG. 2 is a circuit diagram showing the circuit configuration of the SMD type LED lamp according to the embodiment of the invention. FIG. 3 is a graph showing luminous intensity distribution characteristic of the SMD type LED lamp according to the embodiment of the invention.

As shown in FIG. 1A, in the SMD type LED lamp 1, one sheet of metal lead 3 is inserted in a synthetic resin or liquid-crystal polymer package 2 so that the lead 3 ranges from a left end or an opening portion 2*a* of the package 2 to a right end thereof in an upper half of the opening 2*a*. Two red light-emitting elements R1 and R2, two blue light-emitting elements B1 and B2 and one green light-emitting element G, i.e. five light-emitting elements in total, are mounted on the lead 3 so as to be arranged at short intervals in a single horizontal row. On the other hand, in a lower half of the opening portion 2*a*, a protrusion of the lead 3 is disposed in the nearly center portion, and five sheets of loads 4a, 4b, 4c, 4d and 4e are inserted in the package 2 so as to be at a distance from the lead 3. These leads 3, 4a, . . . , and 4e and the package 2 are integrally formed by insert-molding the package 2 in the condition that the leads 3, 4a, . . . , and 4e are set in an injection-molding mold for the package 2.

The five light-emitting elements are electrically connected as follows. Because anode-side electrodes of the red light-emitting elements R1 and R2 are on their rear surfaces respectively, the red light-emitting elements R1 and R2 are bonded and mounted onto the lead 3 by silver paste so that the anode-side electrodes are connected to the lead 3. Because cathode-side electrodes of the red light-emitting elements R1 and R2 are on their front surfaces, the cathode-side electrodes are bonded to the leads 4a and 4e by wires 5 respectively. On the other hand, because anode-side and cathode-side electrodes of the GaN type blue and groan light-emitting elements D1, D2 and G are on their front surfaces, all the anode-side electrodes are bonded to the downward protrusion of the lead 3 by wires 5 respectively, and the cathode-side electrodes are bonded to the leads 4b, 4c and 4d by wires 5 respectively.

Electrical connections of the five light-emitting elements connected as described above are shown in FIG. 2 as a circuit diagram. As shown in FIG. 2, the electric circuit of the LED lamp 1 is provided as an anode common circuit using the lead 3 as an anode-side terminal (3a). Hence, the number of terminals can be reduced, so that the size of the LED lamp 1 can be reduced.

As shown in FIG. 1B, the opening portion 2a of the package 2 is filled with a transparent epoxy resin 6 and sealed with the resin 6. The transparent epoxy resin 6 is shrunk when cured. Hence, as shown in FIG. 1B, the surface of the transparent epoxy resin 6 is dented in the center portion so that the outer edge portion becomes higher than the center portion. Because the red light-emitting elements R1 and R2 are the highest in element height among the five light-emitting elements R1, B1, G, B2 and R2, the red light-emitting elements R2 and R2 are mounted at opposite ends of the single row so that distances from the light-emitting surfaces of the five light-emitting elements R1, B1, G, B2 and R2 to the surface of the transparent epoxy resin 6 are made substantially uniform or uniform. As a result, luminous intensity distribution characteristics of the respective light-emitting elements R1, B1, G, B2 and R2 are made uniform, so that the LED lamp 1 can be provided as an LED lamp having excellent luminous intensity distribution characteristic. Moreover, color-mixing characteristic of adjacent light-emitting elements is improved, so that the LED lamp 1 can be provided as an LED lamp also excellent in color-mixing characteristic.

In the LED lamp 1, the lead 3 on which the light-emitting elements R1, B1, G, B2 and R2 are mounted protrudes out of the package 2 to form a protrusion located in the center portion of the package 2. Hence, distances from the respective light light-emitting elements R1, B1, G, B2 and R2 to a heat-radiating portion are made uniform, so that heat radiation is made uniform. Hence, light-emitting efficiency is made uniform, so that the LED lamp 1 can be provided as an excellent LED lamp.

In the LED lamp 1 according to this embodiment, the periphery of the opening portion 2a of the package 2 is constituted by slopes 7a provided in the widthwise direction and slopes 7b provided in the lengthwise direction. The inclination of the slopes 7a provided in the widthwise direction is gentle whereas the inclination of the slopes 7b provided in the lengthwise direction is steep. Hence, light emitted through the opening portion 2a is not diffused in the lengthwise direction but diffused in the widthwise direction. As a result, when the LED lamp 1 is used as a backlight unit, efficiency of incidence of light onto a thin light guide plate such as a transparent acrylic plate is improved to thereby contribute to increase in luminance of the backlight unit.

In the LED lamp 1, five light-emitting elements R1, B1, G, B2 and R2 different in wavelength of emitted light are arranged in a signal horizontal row at intervals of a narrow pitch. Hence, color-mixing characteristic is improved more greatly, so that good color-mixing characteristic can be obtained when full-color light is emitted from the LED lamp 1.

Further, as shown in FIG. 1C, the leads 4a, . . . , and 4e pulled down out of the package 2 are bent back or forth along a lower surface of the package 2. Specifically, the leads 4b and 4d are bent forth and the leads 4a, 4c and 4e are bent back. Tips of these leads 4a, . . . , and 4c are further bent up along side surfaces of the package 2. That is, the leads are bent twice. When the LED lamp 1 passes through a reflow furnace at a high temperature in order to solder the LED lamp 1 onto a mount board 8, the viscosity of solder 9 is reduced instantaneously. In the LED lamp 1 having such leads bent twice, however, solder 9 is deposited even on the up-bent tips of the leads 4a, . . . , and 4e. Hence, surface tension of solder 9 is balanced on the front and rear (left and right in FIG. 1C) of the package 2 while the skirts of solder 9 are widened. Hence, the LED lamp 1 can be mounted in a predetermined position while prevented from sliding.

In this manner, because the leads 4a, . . . , and 4e are bent up, that is, bent twice, surface tension of solder 9 is balanced on the front and rear of the package 2 while the skirts of solder 9 are widened. Hence, the positioning accuracy of the LED lamp 1 is improved, so that the LED lamp 1 can be mounted accurately.

In the LED lamp 1 according to this embodiment, bluish white light is radiated as a whole because two blue light-emitting elements B1 and B2 and one green light-emitting element G are used. Moreover, the LED lamp 1 brings electric power saving because each of the blue light-emitting elements is superior in light-emitting efficiency to the green light-emitting element. On the other hand, when greenish white light is required, two green light-emitting elements G1 and G2 and one blue light-emitting element B may be preferably used.

Luminous intensity distribution characteristic data of the LED lamp 1 according to this embodiment will be described below with reference to FIG. 3. FIG. 3 shows results of measurement of lengthwise-direction luminous intensity distribution characteristics of the light-emitting elements R1, B1, G, B2 and R2 in the LED lamp 1. As shown in FIG. 3, the luminous intensity distribution characteristics of the five light-emitting elements R1, B1, G, B2 and R2 are substantially uniform and laterally symmetric. It is apparent that the LED lamp 1 has excellent luminous intensity distribution characteristic. This is based on the fact that distances from the light-emitting surfaces of the five light-emitting elements R1, B1, G, B2 and R2 to the surface of the transparent epoxy resin 6 are made uniform because the red light-emitting elements R1 and R2 highest in element height are mounted at opposite ends of the single row as described above.

Figure 4:
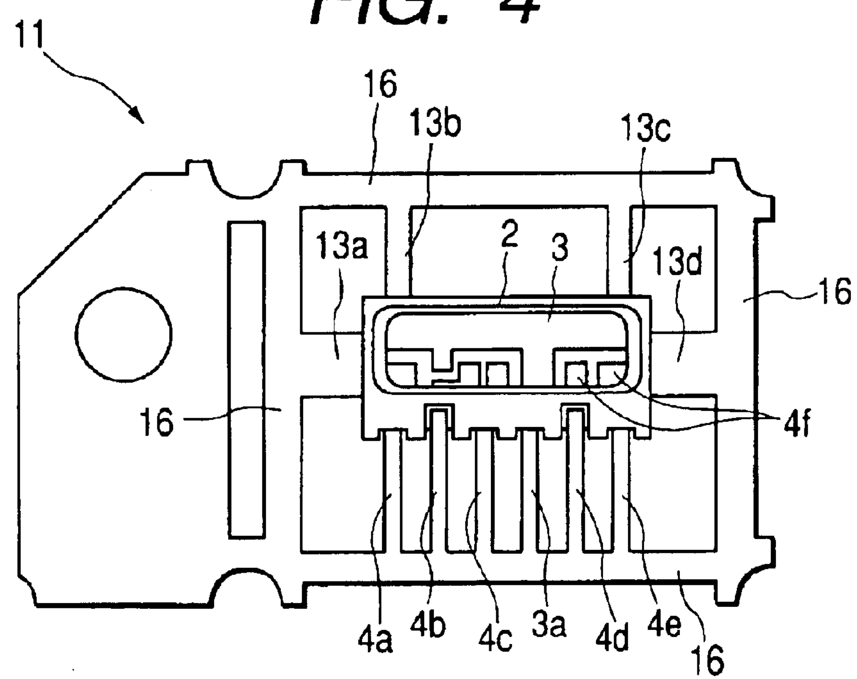
FIG. 4 is a plan view showing the overall configuration of an LED lead frame according to an embodiment or the invention.

Next, a method for manufacturing the LED lamp 1 will be described below with reference to FIG. 4, FIGS. 5A to 5D and FIGS. 6A to 6D. FIG. 4 is a plan view showing the overall configuration of an LED lead frame used for manufacturing the LED lamp 1. In other words, this LED lead frame is an embodiment of the invention. FIGS. 5A, 5B, 5C and 5D are explanatory views showing a first half of a process of bending electrically conductive leads by using the LED lead frame according to the embodiment of the invention. FIGS. 6A, 6D, 6C and 6D are explanatory views showing a second half of the process of bending electrically conductive leads by using the LED lead frame according to the embodiment of the invention.

As shown in FIG. 4, in the LED lead frame 11 according to this embodiment, a hanger lead 13*a* is extended from a left portion of an outer frame 16 and fixed to a package 2 surrounded by the outer fame 16 provided in four directions, a pair of hanger leads 13*b* and 13*c* are extended from an upper portion of the outer frame 16 and fixed to the package 2, and a hanger lead 13*d* is extended from a right portion of the outer frame 16 and fixed to the package 2. On the other hand, six electrically conductive leads 4*a*, 4*b*, 4*c*, 3*a*, 4*d* and 4*e* are extended from a lower portion of the outer frame 16 into the package 2. Tips of the electrically conductive leads are provided as leads 3 or 4*f* for mounting light-emitting elements packed in the package 2 and performing wire-bonding.

The LED lead frame 11 configured as described above is produced as follows. After a metal plate is punched to form the hanger leads 13*a*, 13*b*, 13*c* and 13*d*, the electrically conductive leads 4*a*, . . . , and 4*c* and the leads 3 or 4*f* as tips thereof, the package 2 is produced in the center by injection molding a liquid crystal polymer to thereby connect the leads. Thus, the LED lead frame 11 is produced.

The process of bending the electrically conductive leads 4*a*, . . . , and 4*c* by using the LED lead frame 11 configured as described above will be described below with reference to FIGS. 5A to 5D and FIGS. 6A to 6D. First, as shown in FIG. 5A, light-emitting elements are mounted in the package 2 and wire-bonded to make electrical connections. That is, the red light-emitting element R1, the blue light-emitting element B1, the green blue light-emitting element G, the blue light-emitting element B2 and the red light-emitting element R2 are all mounted on one sheet of lead 3 which occupies an upper half of an opening portion of the package 2 and which is equivalent to a tip of one 3*a* of the six electrically conductive leads 4*a*, . . . , and 4*e*. Then, electrodes of the light-emitting elements are bonded to the sheet of lead 3 and the other sheets of leads 4*f* by eight wires. Thus, anode-common electrical connection is completed. Then, the opening portion of the package 2 is sealed with a transparent epoxy resin. Thus, the configuration of the LED lamp is completed.

Figure 5B:
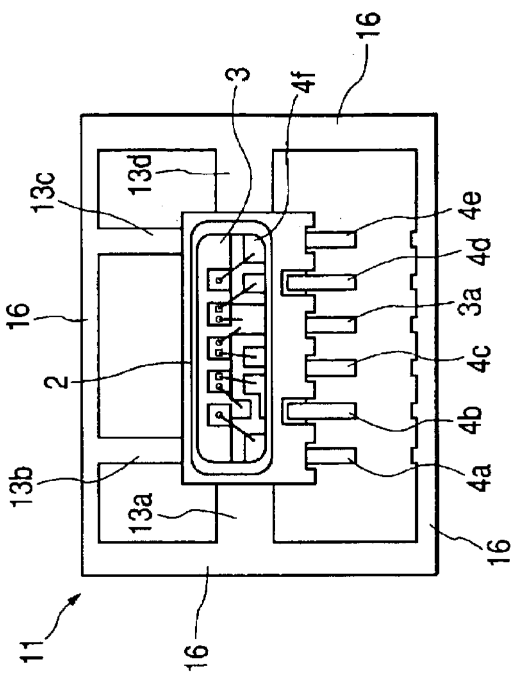
FIGS. 5A, 5B, 5C and 5D are explanatory views showing a first half of a process of bending electrically conductive leads by using the LED lead frame according to the embodiment of the invention.
Figure 5D:
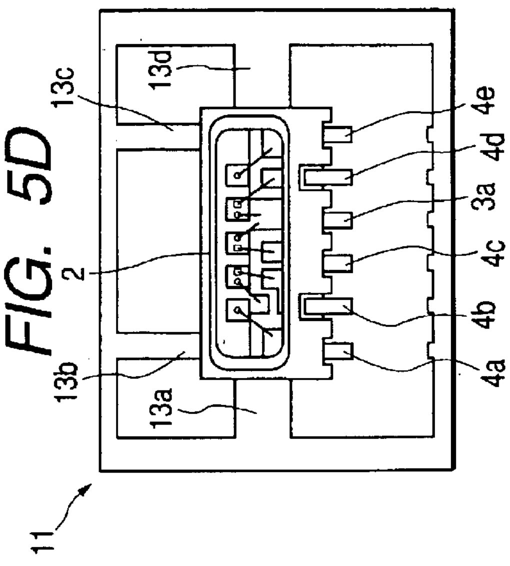
Figure 5A:
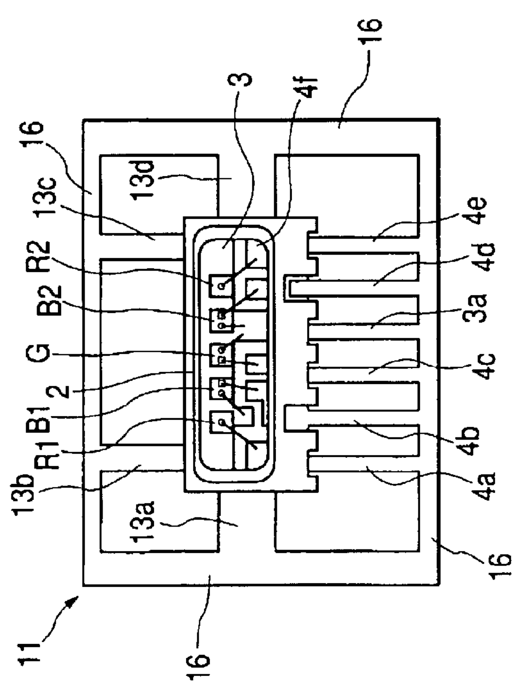
Figure 5C:
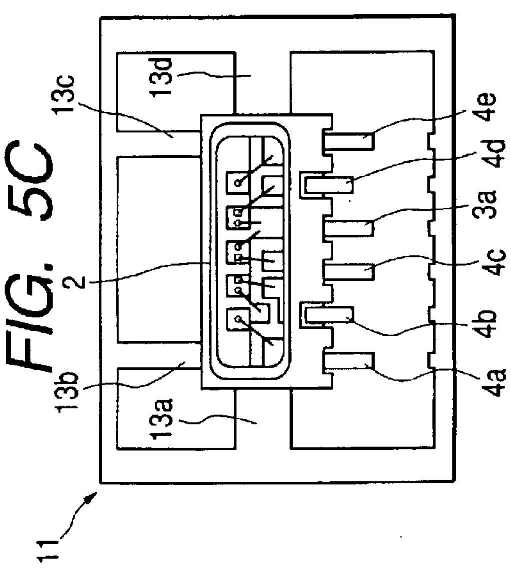

Then, as shown in FIG. 5B, the electrically conductive leads 4*a*, . . . , and 4*e* are cut into a predetermined length and separated from the outer frame 16. In the case of a related-art LED lead frame, the package 2 becomes free at this stage. In the LED lead frame 11 according to this embodiment, the package 2 is, however, fixed firmly by the hanger leads 13*a*, 13*b*, 13*c* and 13*d* extended in three directions. Then, as shown in FIG. 5C, tips of two electrically conductive leads 4*b* and 4*d* bent forth are bent forth substantially perpendicularly. Then, as shown in FIG. 5D, tips of the other four electrically conductive leads 4*a*, 4*c*, 3*a* and 4*e* are bent back substantially perpendicularly. Even in the case where the electrically conductive leads 4*a*, . . . , and 4*e* are bent back and forth in the this manner, the electrically conductive leads 4*a*, . . . , and 4*e* can be bent accurately without tottering because the package 2 is fixed firmly by the hanger leads 13*a*, 13*b*, 13*c* and 13*d*.

Figure 6B:
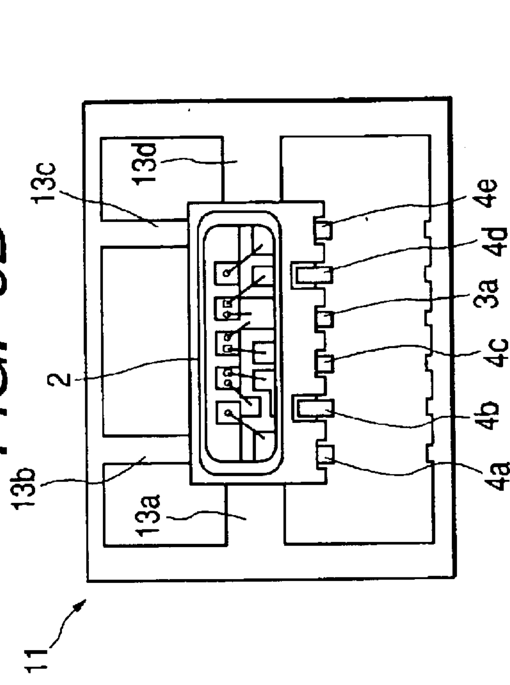
FIGS. 6A, 6B, 6C and 6D are explanatory views showing a second half of the process of bending electrically conductive leads by using the LED lead frame according to the embodiment of the invention.
Figure 6D:
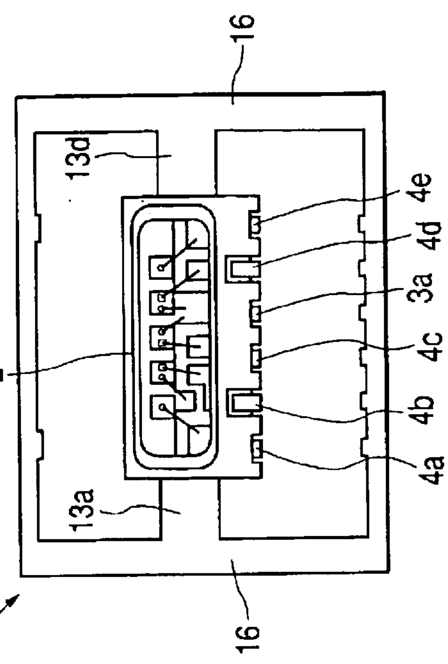
Figure 6A:
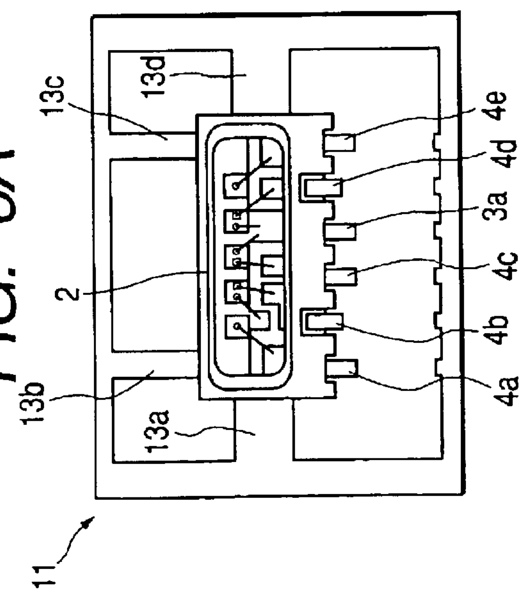
Figure 6C:
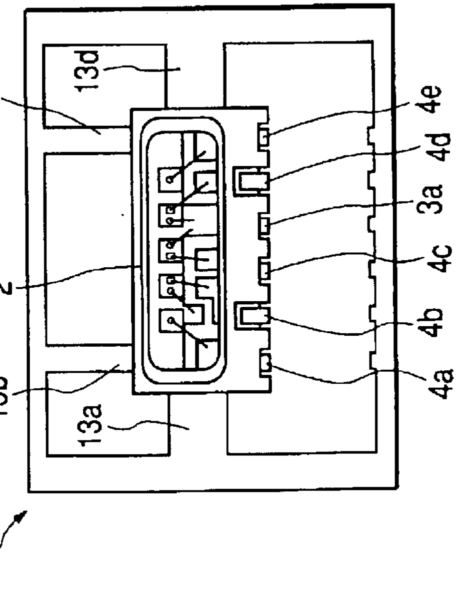
Figure 7:
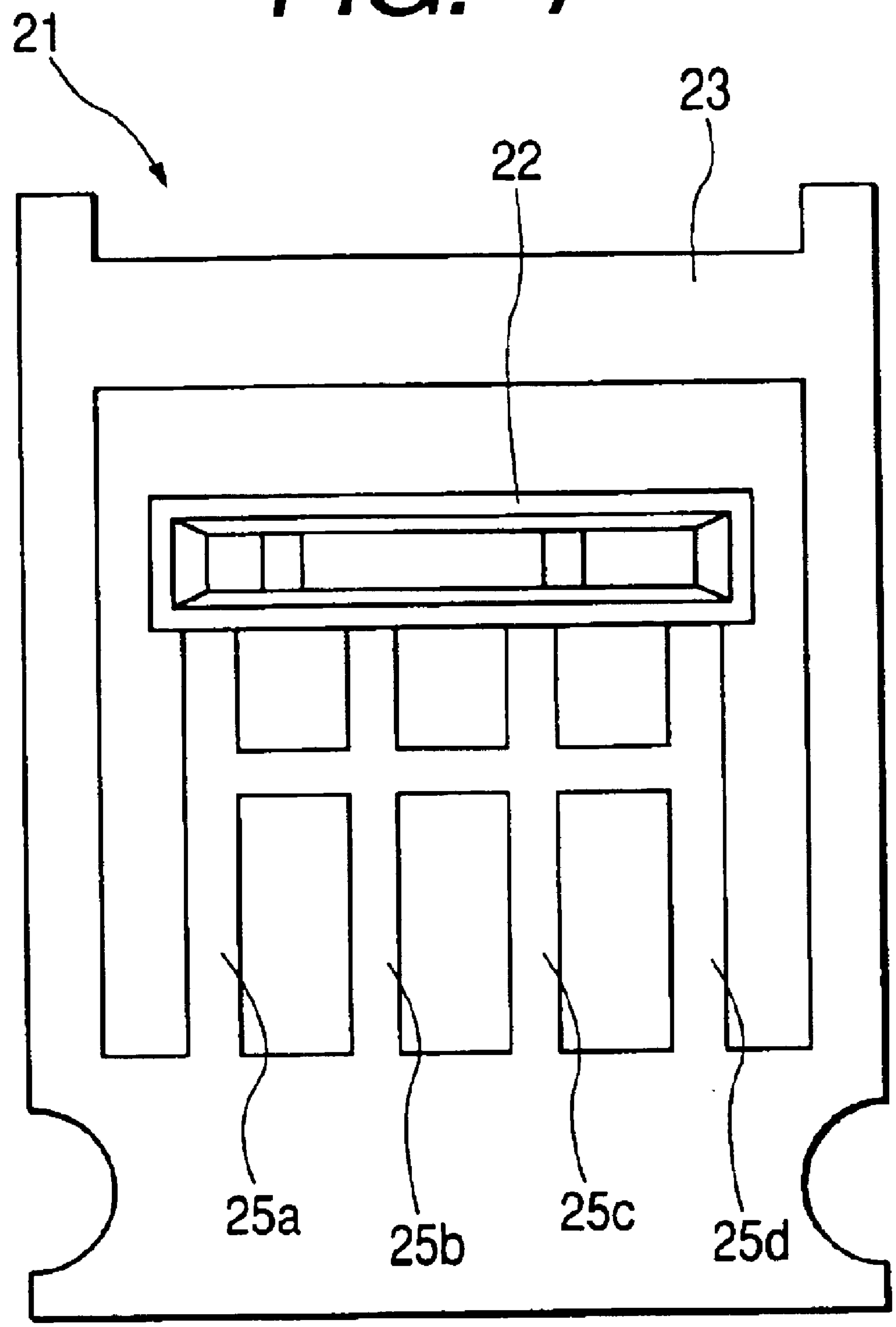
FIG. 7 is a plan view showing the configuration of a related-art LED lead frame.

Then, as shown in FIG. 6A, the electrically conductive leads 4*b* and 4*e* are bent forth by about 45° from vicinities of their bases. When the electrically conductive leads are not bent substantially perpendicularly at once but bent about 45° by about 45° in this manner, more accurate bending can be made. Then, as shown in FIG. 6B, the other electrically conductive leads 4*a*, 4*c*, 3*a* and 4*e* are bent back by about 45°. Then, as shown in FIG. 6C, the electrically conductive leads 4*b* and 4*d* are bent forth perfectly so as to come into contact with the outer circumference of the package 2 whereas the electrically conductive leads 4*a*, 4*c*, 3*a* and 4*e* are bent back perfectly so as to come into contact with the outer circumference of the package 2.

After the process of bending the electrically conductive leads 4*a*, . . . , and 4*e* is completed as described above, the package 2 is separated from the LED lead frame 11. First, as shown in FIG. 6D, the pair of upper hanger leads 13*b* and 13*c* are cut and removed. Then, the pair of residual hanger leads 13*a* and 13*d* are cut at points near the outer frame 6 and ends of fragments are removed from the package 2. In this manner, the package 2 is taken out from the LED lead frame 11.

As described above, in the LED lead frame 1 according to this embodiment, hanger leads 13*a*, 13*b*, 13*c* and 13*d* extended in three directions of the package 2 are provided. Hence, the electrically conductive leads 4*a*, . . . , and 4*e* can be bent stably and accurately without tottering of the package 2 in the process or bending the electrically conductive leads 4*a*, . . . , and 4*c*. The accuracy in the bending process at this stage is very important because it has influence on the positional accuracy with respect to a partner member in a post-process. Moreover, there is no fear that the package 2 may be broken because it is unnecessary to press the package 2.

Further, in the LED lead frame 11 according to this embodiment, because two hanger leads are extended in a direction opposite to the electrically conductive leads 4*a*, . . . , and 4*e*, the package 2 can be surely prevented from warping when the electrically conductive leads 4*a*, . . . , and 4*e* are bent back or forth along the package 2 in the process of bending the electrically conductive leads 4*a*, . . . , and 4*e*. As result, the electrically conductive leads 4*a*, . . . , and 4*e* can be bent more surely with stable accuracy.

Further, in the LED lead frame 11 according to this embodiment, because each of the two hanger leads 13*a* and 13*d* extended in directions substantially perpendicular to the electrically conductive leads 4*a*, . . . , and 4*e* is wide, stiffness becomes large. Hence, the package 2 can be surely prevented from warping when the electrically conductive leads 4*a*, . . . , and 4*e* are bent back or forth along the package 2 in the process of bending the electrically conductive leads 4*a*, . . . , and 4*e*. As result, the electrically conductive leads 4*a*, . . . , and 4*e* can be bent more surely with stable accuracy.

Although this embodiment has shown the case where the number of hanger leads extended in a direction opposite to the electrically conductive leads 4*a*, . . . , and 4*e* is two, the invention is not limited thereto and the number of such hanger leads may be one or three or more. Further, each of the hanger leads extended in a direction opposite to the electrically conductive leads 4*a*, . . . , and 4*e* may be widened.

Although this embodiment has shown the case where the two hanger leads 13*a* and 13*d* extended in directions substantially perpendicular to the electrically conductive leads 4*a*, . . . , and 4*e* are widened, the two hanger leads 13*a* and 13*d* need not be widened.

Although this embodiment has shown the case where three color types of light-emitting elements for emitting light with red, green and blue which are light's three primary colors are used for forming a white LED device, it is a matter of course that any other color type light-emitting element may be used, and that four or more color types of light-emitting elements may be used, or two color types of light-emitting elements or a plurality of one color type light-emitting elements may be used.

Although this embodiment has shown the case where a liquid-crystal polymer which is one kind of synthetic resin is used as the material of the package, any other material such as another synthetic resin may be also used. The method of forming the package is not limited to the injection molding method and any other molding method may be used.

Although this embodiment has shown the case where a transparent epoxy resin is used as the light-transmissive material which serves as a sealing material, any other light-transmissive material such as a transparent silicone resin may be also used if the material can satisfy the conditions of fluidity and filling characteristic before curing and transparency and strength after curing.

The configuration, shape, number, material, size, connection relation, etc. of other parts of the LED device or the LED lead frame are not limited to this embodiment.

(1) As described above, according to the invention, there is provided an LED device having: a plurality of light-emitting elements sealed with a light-transmissive material in a package, wherein: the plurality of light-emitting elements are arranged in a single row in the inside of an opening portion of the package and in order of element height so that a light-emitting element higher in element height is disposed on an outer side of the single row; and the inside of the opening portion of the package is sealed with the light-transmissive material.

The light-transmissive material for sealing the inside of the opening portion of the package is shrunk when cured from a liquid state. For this reason, the surface of the light-transmissive material in the center portion of the package is dented so that the outer side of the package becomes higher than the center portion. Accordingly, when the plurality of light-emitting elements are arranged in such order of element height that a light-emitting element higher in element height is disposed on an outer side of the single row, distances from light-emitting surfaces of the respective light-emitting elements to the surface of the light-transmissive material are made uniform, so that luminous intensity distribution characteristic is made uniform.

In this manner, in the LED device having a plurality of light-emitting elements sealed with a light-transmissive material in a package, luminous intensity distribution characteristic can be improved.

(2) According to the invention, in the LED device having the configuration defined in (1), one sheet of electrically conductive lead for mounting the plurality of light-emitting elements protrudes out of the package to thereby form a protrusion provided in a center portion of the package.

With such a configuration, in addition to the advantage described in (1), distances from the respective light-emitting elements to a heat-radiating portion are made uniform, so that heat radiation is made uniform. Accordingly, light-emitting efficiency is made uniform, so that the LED device can be provided as an excellent LED device.

(3) According to the invention, in the LED device having the configuration defined in (1) or (2), the opening portion has its periphery constituted by slopes provided in a lengthwise direction of the package and slopes provided in a widthwise direction of the package, and the slopes provided in the lengthwise direction are different in inclination from the slopes provided in the widthwise direction so that the inclination of the slopes provided in the widthwise direction is gentler.

With such a configuration, in addition to the advantage described in (1) or (2), the opening portion is formed so that light is not diffused in the lengthwise direction but light is diffused in the widthwise direction. Hence, it is easy to guide light into a thin light guide plate. This contributes to increase in luminance of a backlight unit. In addition, when a plurality of such LED devices are used, color-mixing characteristic of adjacent LED devices is improved.

(4) According to the invention, in the LED device having the configuration defined in any one of (1) through (3), the plurality of light-emitting elements are different in wavelength of emitted light and are arranged in a single row at intervals at a narrow pitch.

With such a configuration, in addition to the advantage described in any one of (1) through (3), color-mixing characteristic of the light-emitting elements is improved in all wavelengths of emitted light, so that good color-mixing characteristic is obtained when light in full color is emitted from the LED device.

(5) According to the invention, in the LED device having the configuration defined in any one of (1) through (4), the plurality of light-emitting elements include at least one red light-emitting element, at least one green light-emitting element, and at least one blue light-emitting element.

In this manner, when the LED device is constituted by three color types of light-emitting elements for emitting light in red, green and blue which are light's three primary colors, in addition to the advantage described in any one of (1) through (4), the LED device can be used as a light source for a backlight unit because white light is emitted from the LED device. In addition, because the opening portion is formed so that light is diffused in the widthwise direction, it is easy to guide light into a thin light guide plate. Hence, the LED device contributes to increase in luminance of a backlight unit.

(6) According to the invention, in the LED device having the configuration defined in any one of (1) through (5), the plurality of light-emitting elements include two red light-emitting elements disposed on outer sides respectively, two blue light-emitting elements disposed on inner sides of the two red light-emitting elements respectively, and one green light-emitting element disposed in a center of the single row.

In addition to the advantage described in any one of (1) through (5), each of a red light-emitting element and a blue light-emitting element is lower in luminance than a green light-emitting element. Hence, when two red light-emitting elements and two blue-light-emitting elements are used, the three colors are balanced to obtain white light emission in a state of uniform heat load balance. Moreover, because a blue light-emitting element is superior in light-emitting efficiency to a green light-emitting element, the LED device is suitable for the purpose of requiring bluish white light or for the purpose of requiring electric power saving. In addition, a red light-emitting element is higher in element height than each of a green light-emitting element and a blue-light-emitting element. Hence, when the red light emitting elements are disposed on outermost sides respectively, distances from light-emitting surfaces of the respective light-emitting elements to the surface of the sealing material dented in the center portion are made uniform, and luminous intensity distribution characteristic is improved.

(7) As described above, according to the invention, there is provided an LED device having: a package; a plurality of leads; a plurality of light-emitting elements electrically connected to the plurality of leads; and a light-transmissive material with which the plurality of leads and the plurality of light-emitting elements are sealed in the package; wherein: protrusions of the plurality of leads pulled down out of the package are bent back and forth and/or left and right along a lower surface of the package; and tips of the plurality of bent leads are further bent up along side surfaces of the package.

Hence, when the LED device is soldered onto a mount board, solder is deposited even on the tips of the leads bent up along the side surfaces of the package. Surface tension of solder is balanced on the front and rear or left and right of the package while the skirts of solder are widened. Hence, the LED device can be mounted in a predetermined position while prevented from sliding.

In this manner, because the leads are bent up, that is, bent twice, surface tension of solder is balanced on the front and rear or left and right of the package while the skirts of solder are widened. Hence, the positioning accuracy of the LED device is improved, so that the LED device can be mounted accurately.

(8) According to the invention, in the LED device having the configuration defined in (7), protrusions of the plurality of leads are bent back and forth along a lower surface of the package, and tips of the plurality of bent leads are further bent up along side surfaces of the package.

In addition to the advantage described in (7), because the direction of bending of the leads is limited to a back-and-forth direction thus, solder can be deposited on the package along the lengthwise direction of the package when the LED device is mounted. Hence, the length on which surface tension of the solder is applied is elongated so that more strongly balanced force is applied on the LED device. As a result, the LED device can be positioned more accurately when mounted.

(9) As described above, according to the invention, there is provided an LED lead frame for producing an LED device having a single light-emitting element or a plurality of light-emitting elements sealed with a light-transmissive material in a package, having: a plurality of electrically conductive leads for mounting the single light-emitting element or the plurality of light-emitting elements packed in the package, the plurality of electrically conductive leads being protruded out from one side of the package and connected to an outer frame of the LED lead frame; and a plurality of hanger leads protruded out from three sides of the package other than the one side of the package and connected to the outer frame.

In the LED lead frame configured as described above, even after the electrically conductive leads are cut into a predetermined length, the package is fixed to the outer frame by the hanger leads extended in other three directions. Accordingly, also in a process of bending back or forth the electrically conductive leads along the package, the electrically conductive leads can be bent accurately without tottering because the package is fixed firmly. Moreover, because the package is fixed to the outer frame by the hanger leads extended in three directions, it is unnecessary to press the package so long as the outer frame is fixed firmly. Hence, there is no fear that the package may be broken. Incidentally, after the process of bending the electrically conductive leads is completed, the hanger leads which have become unnecessary may be preferably removed.

In this manner, the LED lead frame is provided as an LED lead frame in which the electrically conductive leads can be bent with stable accuracy while the package is fixed firmly without being damaged in the process of bending the electrically conductive leads.

(10) According to the invention, in the LED lead frame having the configuration defined in (9), ones of the plurality of hanger leads are provided in a direction of a side which is among the three sides of the package and opposite to the one side of the package.

In this manner, because a plurality of hanger leads are provided in a direction of a side opposite to the one side of the package, that is, in a direction opposite to the pulling-out direction of the electrically conductive leads, in addition to the advantage described in (9), the package can be surely prevented from warping when the electrically conductive leads are bent back or forth along the package in the process of bending the electrically conductive leads. Hence, the electrically conductive leads can be bent more surely with stable accuracy.

(11) According to the invention, in the LED lead frame having the configuration defined in (9) or (10), the ones of the plurality of hanger leads provided in the direction of the side which is among the three sides of the package and opposite to the one side of the package are wide.

In this manner, in addition to the advantage described in (9) or (10), each of the hanger leads provided in a direction of a side opposite to the one side of the package, that is, in a direction opposite to the pulling-out direction of the electrically conductive leads is made wide, so that stiffness becomes large. Hence, the package can be surely prevented from warping when the electrically conductive leads are bent back or forth along the package in the process of bending the electrically conductive leads. Hence, the electrically conductive leads can be bent more surely with stable accuracy.

(12) According to the invention, in the LED lead frame having the configuration defined in any one of (9) through (11), ones of the plurality of hanger leads provided in directions of two sides among the three sides of the package and substantially perpendicular to the plurality or electrically conductive leads are wide.

In this manner, in addition to the advantage described in any one of (9) through (11), each of the hanger leads provided in two directions substantially perpendicular to the plurality of electrically conductive leads is made wide, so that stiffness against warping force in the widthwise direction becomes large. Hence, the package can be surely prevented from warping when the electrically conductive leads are bent hark or forth along the package in the process of bending the electrically conductive leads. Hence, the electrically conductive leads can be bent more surely with stable accuracy.

Although the invention has been described in its preferred form with a certain degree of particularity, it is understood that the present disclosure of the preferred form can be changed in the details of construction and in the combination and arrangement of parts without departing from the spirit and the scope or the invention as hereinafter claimed.

What is claimed is:

1. A method for manufacturing an LED device comprising:

preparing an LED lead frame having at least one electrically conductive lead connected to one side of an outer frame of said LED lead frame, and a plurality of hanger leads protruded out toward and connected to three sides of said outer frame different from said one side to which said electrically conductive lead is connected;

mounting at least one light-emitting element on said electrically conductive lead;

sealing said light-emitting element with a light-transmissive material to form a package containing said light-emitting element such that a part of said electrically conductive lead is protruded out from said one side of said package and connected to said outer frame; and separating said electrically conductive lead from said outer frame.

2. A method for manufacturing an LED device according to claim 1, wherein ones of said plurality of hanger leads are provided in a direction of a side which is among said three sides of said package and opposite to said one side of said package.

3. A method for manufacturing an LED device according to claim 1, wherein said ones of said plurality of hanger leads provided in the direction of the side which is among said three sides of said package and opposite to said one side of said package are wide.

4. A method for manufacturing an LED device according to claim 1, wherein ones of said plurality of hanger leads provided in directions of two sides among said three sides of said package and substantially perpendicular to said plurality of electrically conductive leads are wide.

5. A method for manufacturing an LED device according to claim 1, further comprising folding said electrically conductive lead after said separating.

6. A method for manufacturing an LED device according to claim 5, wherein a plurality of electrically conductive leads are formed in said LED lead frame, and adjacent leads are folded different in a the LED lead frame.

* * * * *